(12) United States Patent
Kwon et al.

(10) Patent No.: US 8,388,398 B2
(45) Date of Patent: Mar. 5, 2013

(54) METHOD OF MANUFACTURING SUBSTRATE AND ORGANIC EMITTING DISPLAY DEVICE HAVING THE SUBSTRATE

(75) Inventors: Oh-June Kwon, Suwon-si (KR); Kwan-Hee Lee, Suwon-si (KR); Seung-Yong Song, Suwon-si (KR); Young-Seo Choi, Suwon-si (KR); Sun-Young Jung, Suwon-si (KR); Young-Cheol Joo, Suwon-si (KR); Ji-Hun Ryu, Suwon-si (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/101,107

(22) Filed: May 4, 2011

(65) Prior Publication Data

US 2011/0207325 A1  Aug. 25, 2011

Related U.S. Application Data

(62) Division of application No. 12/318,695, filed on Jan. 6, 2009, now Pat. No. 7,960,911.

(30) Foreign Application Priority Data

Apr. 24, 2008  (KR) ........................ 10-2008-0038251

(51) Int. Cl.
*H01J 9/00* (2006.01)
*H01L 21/306* (2006.01)

(52) U.S. Cl. ........................................ 445/23; 438/690
(58) Field of Classification Search .............. 445/23–25; 438/690
See application file for complete search history.

(56) References Cited

U.S. PATENT DOCUMENTS

| 6,777,871 | B2 | 8/2004 | Duggal et al. |
| 2002/0070664 | A1* | 6/2002 | Terao et al. .................... 313/582 |
| 2004/0104672 | A1 | 6/2004 | Shiang et al. |
| 2005/0035983 | A1* | 2/2005 | Cruchon-Dupeyrat et al. ........................ 346/140.1 |
| 2006/0012739 | A1* | 1/2006 | Shibazaki ...................... 349/122 |
| 2007/0285007 | A1* | 12/2007 | Lee et al. ....................... 313/504 |
| 2008/0201944 | A1* | 8/2008 | Sakamoto et al. .............. 29/846 |

FOREIGN PATENT DOCUMENTS

| JP | 2004045478 A | * | 2/2004 |
| KR | 1020040084829 | | 10/2004 |
| KR | 1020050050049 | | 5/2005 |
| KR | 1020070050226 | | 5/2007 |
| KR | 1020070111349 | | 11/2007 |

OTHER PUBLICATIONS

Korean Office Action issued by Korean Intellectual Property Office on Jun. 25, 2009 in Applicant's corresponding Korean Patent Application No. 10-2008-0038251.

Korean Registration Determination Certificate issued by Korean Intellectual Property Office on Nov. 30, 2009 in Applicant's corresponding Korean Patent Application No. 10-2008-0038251.

* cited by examiner

*Primary Examiner* — Joseph L Williams
(74) *Attorney, Agent, or Firm* — Robert E. Bushnell, Esq.

(57) ABSTRACT

Provided are an organic light emitting display device and a method of manufacturing the same. The organic light emitting display device includes a substrate; an sealing substrate facing the substrate, an organic light emitting unit disposed between the substrate and the sealing substrate and having a plurality of organic light emitting devices emitting light, and a plurality of grooves formed in a light extracting surface of the organic light emitting display device through which the light is emitted to the outside. In one embodiment, the grooves are formed on the sealing substrate, and in another embodiment, the grooves are formed on the substrate.

5 Claims, 9 Drawing Sheets

METHOD OF MANUFACTURING SUBSTRATE AND ORGANIC EMITTING DISPLAY DEVICE HAVING THE SUBSTRATE

CROSS-REFERENCE TO RELATED APPLICATIONS AND CLAIM OF PRIORITY

This application is a divisional application of the prior application Ser. No. 12/318,695 filed in the U.S. Patent & Trademark Office on 6 Jan. 2009 and assigned to the assignee of the present invention. Furthermore, this application makes reference to, incorporates the same herein, and claims all benefits accruing under 35 U.S.C. §119 from an application for METHOD OF MANUFACTURING SUBSTRATE AND ORGANIC EMITTING DISPLAY DEVICE HAVING THE SUBSTRATE earlier filed in the Korean Intellectual Property Office on the 24th of Apr. 2008 and there duly assigned Ser. No. 10-2008-0038251.

BACKGROUND OF THE INVENTION

1. Field of the Invention

The present invention relates to a method of manufacturing a substrate and an organic light emitting display device having the substrate, and particularly, to a method of manufacturing a substrate which improves the visibility due to reduced reflectivity of external light, and an organic light emitting device having the substrate.

2. Description of the Related Art

In general, flat panel displays (FPDs) are classified according to the material type into inorganic display devices and organic display devices. Examples of inorganic display devices include plasma display panels (PDPs) using photoluminescence (PL) and field emission displays (FEDs) using cathode luminescence (CE). Examples of organic display devices include liquid crystal displays (LCDs) and organic light emitting element devices.

An organic light emitting element device includes a first electrode and a second electrode facing each other, and a light emitting layer interposed between the first and second electrodes. Since the organic light emitting element device is easily damaged by water or oxygen from the outside, the organic electroluminescent display device is encapsulated in order to prevent penetration of impurities from the outside.

As the organic light emitting display devices, including the organic light emitting element devices, have higher response speed than the currently widely used LCDs, the organic display devices can realize mobile images and have a wide viewing angle and high brightness due to self-emission, and thus are considered to be the next-generation of display devices.

SUMMARY OF THE INVENTION

The present invention provides an organic light emitting display device having improved visibility by reducing the reflectivity of incident light, and a method of manufacturing the organic light emitting display device.

According to an aspect of the present invention, there is provided an organic light emitting display device comprising a substrate, an sealing substrate facing the substrate, an organic light emitting unit disposed between the substrate and the sealing substrate and including a plurality of organic light emitting devices for emitting light, and a plurality of grooves formed in a light extracting surface of the organic light emitting display device through which the light is emitted to the outside.

The light extracting surface may be one surface of the sealing substrate that is directed to the outside. The light extracting surface may be one surface of the substrate that is directed to the outside.

The grooves may be regularly arranged or irregularly arranged.

The grooves may be concave with respect to the light extracting surface.

The grooves may be formed in the form of concave lenses. The grooves may be formed in the form of spherical concave lenses. The grooves may be formed in the form of oval concave lenses. The grooves may be concavely formed in the form of slits. The grooves may be formed to overlap one another in a continuous arrangement.

One of the grooves may be spatially aligned with one of the organic light emitting devices. The size of the one of the grooves may be smaller than the size of the one of the organic light emitting devices.

A distance between two of the grooves may be greater than a distance between two of the organic light emitting devices.

According to another aspect of the present invention, there is provided a method of manufacturing a substrate, the method comprising providing a substrate, forming scratches in a surface of the substrate, and forming a plurality of grooves by spraying an etchant onto the surface of the substrate.

The scratches may be formed at regular distances from each other. The scratches may be formed at irregular distances from each other. The grooves may be concavely formed with respect to the surface of the substrate.

The step of forming the plurality of grooves may comprise etching the surface of the substrate by the etchant, and cleansing the surface of the substrate.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
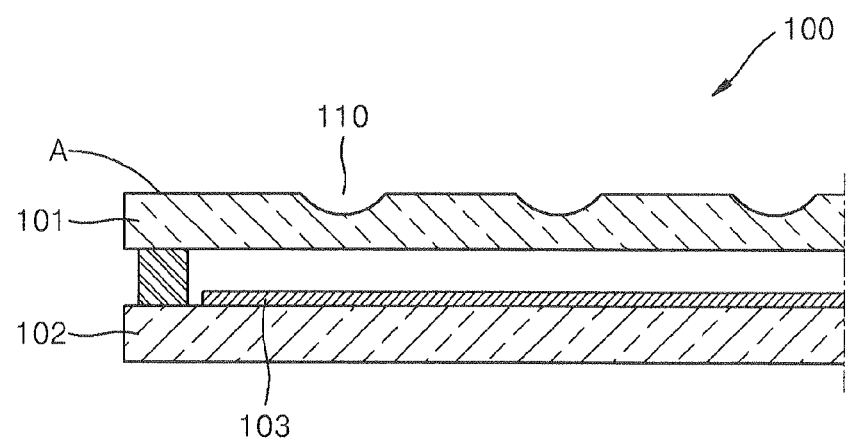
FIG. 1 is a cross-sectional view of an organic light emitting display device according to an embodiment of the present invention.

The present invention will now be described more fully with reference to the accompanying drawings, in which exemplary embodiments of the invention are shown. The invention may, however, be embodied in many different forms, and should not be construed as being limited to the embodiments set forth herein; rather, these embodiments are provided so that this disclosure will be thorough and complete, and will fully convey the concept of the invention to those skilled in the art. Thus, the shape and size of the elements in the drawings may be exaggerated for clarity, and like reference numerals denote like elements throughout the specification.

FIG. 1 is a cross-sectional view of an organic light emitting display device 100 according to an embodiment of the present invention. Referring to FIG. 1, the organic light emitting display device 100 may include a sealing substrate 101, a substrate 102, an organic light emitting unit 103, and grooves 110.

The sealing substrate 101 may be disposed above the organic light emitting unit 103 and attached to the substrate 102. As illustrated in FIG. 1, the sealing substrate 101 may be separated from the organic light emitting unit 103 and attached to the substrate 102 using a bonding member (not shown). The sealing substrate 101 may be a glass substrate or other various plastic substrates such as acryl. When the organic light emitting display device 100 is a top emission type organic light emitting device as illustrated in FIG. 1, the sealing substrate 101 may be formed of an electric insulating material having high transmittance with respect to light generated from the organic light emitting unit 103. For example, the sealing substrate 101 may be formed of a transparent glass such as alkali glass or non-alkali glass, transparent ceramics such as polyethylene terephtahlate, polycarbonate, polyether sulfone, polyvinyl fluoride (PVF), poly acrylate, zirconia, etc., or quartz.

The organic light emitting unit 103 is formed on the substrate 102. The substrate 102 may be formed of a material such as transparent glass, plastic sheet, or silicon, and may be either flexible or not flexible, and either transparent or not transparent. Also, the substrate 102 may be a metal substrate. When an organic light emitting display device 200 is a bottom emission type organic light emitting display device, a substrate 202 is formed of a transparent material.

The organic light emitting unit 103 may be formed on the substrate 102. The organic light emitting unit 103 may include a plurality of organic light emitting devices (not shown). The organic light emitting device may include a first electrode layer, a second electrode layer facing the first electrode layer, and an intermediate layer interposed between the first and second electrode layers and including at least a light emitting layer. The first electrode layer may be a transparent electrode or a reflective electrode.

When the first electrode layer is formed of a transparent electrode, it may be formed of ITO, IZO, ZnO or $In_2O_3$; and when formed of a reflective electrode, the first electrode layer may be formed of a reflection layer formed of Ag, Mg, Al, Pt, Pd, Au, Ni, Nd, Ir, Cr, or a compound of these, and a layer formed of ITO, IZO, ZnO or $In_2O_3$, and formed on the reflection layer. The second electrode layer also may be formed of a transparent electrode or a reflective electrode. When formed of a transparent electrode, the second electrode layer may include a layer in which Li, Ca, LiF/Ca, LiF/Al, Al, Mg or a compound of these is deposited to direct to the intermediate layer between the first and second layers, and an auxiliary electrode or a bus electrode line formed of a material for forming a transparent electrode (e.g., ITO, IZO, ZnO or $In_2O_3$). When formed of a reflective electrode, the second electrode layer may be formed by depositing Li, Ca, LiF/Ca, LiF/Al, Al, Mg or a compound of these. The intermediate layer between the first and second electrodes may be formed of a small molecular organic material or a polymer organic material. When using a small molecular organic material, the intermediate layer may be formed to have a single or complex structure including a hole injection layer (HIL), a hole transport layer (HTL), an emission layer (EML), an electron transport layer (ETL), an electron injection layer (EIL), etc. Examples of the organic materials include copper phthalocyanine (CuPc), N,N'-Di (naphthalene-1-yl)-N,N'-diphenyl-benzidine (NPB), tris-8-hydroxyquinoline aluminum) (Alq3), and so forth. The small molecular organic material may be formed using a vacuum deposition method using a mask. The polymer organic material may have a structure including an HTL and an EML; here, poly(3,4-ethylenediox-ythiophene) (PEDOT) may be used as an HTL, and polymer organic materials such as poly-phenylenevinylene (PPV) based materials or polyfluorene based materials may be used as an EML.

A plurality of grooves 110 may be formed in a light extracting surface A of the organic light emitting display device 100. As shown in FIG. 1, the light extracting surface A is a surface of the sealing substrate 101 directed to the outside in the top emission type organic light emitting display device 100. Light generated in the organic light emitting unit 103 is emitted to the outside through the sealing substrate 101, and thus a surface of the sealing substrate 101 may be the light extracting surface A.

Figure 2:
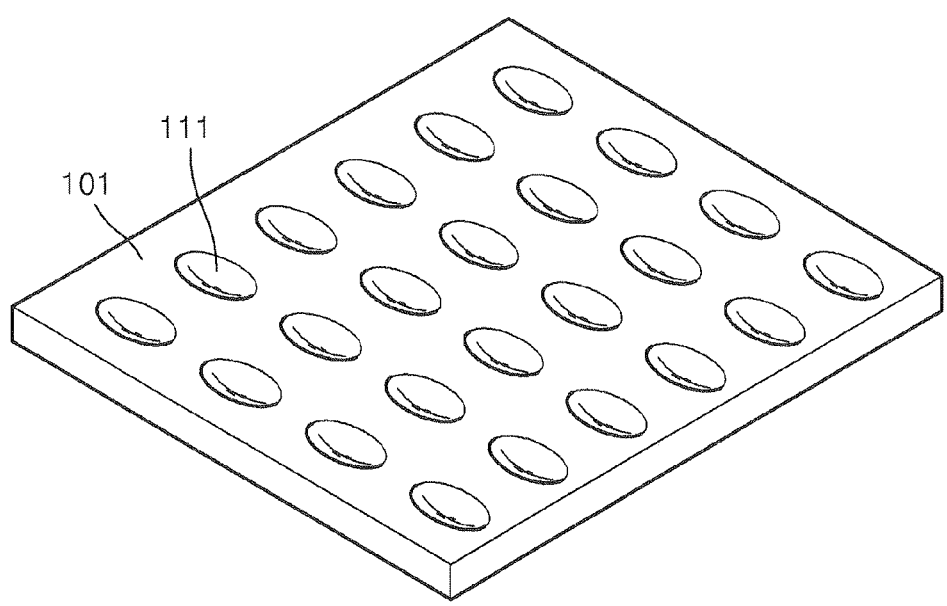
FIGS. 2 through 4 are perspective views respectively illustrating a substrate in which various types of grooves are formed.
Figure 3:
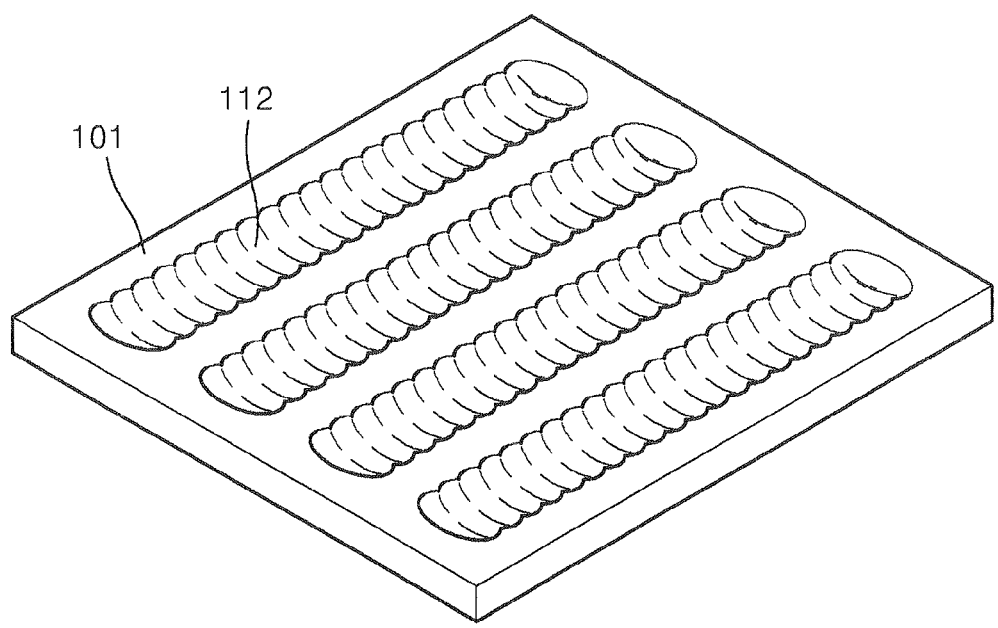
Figure 4:
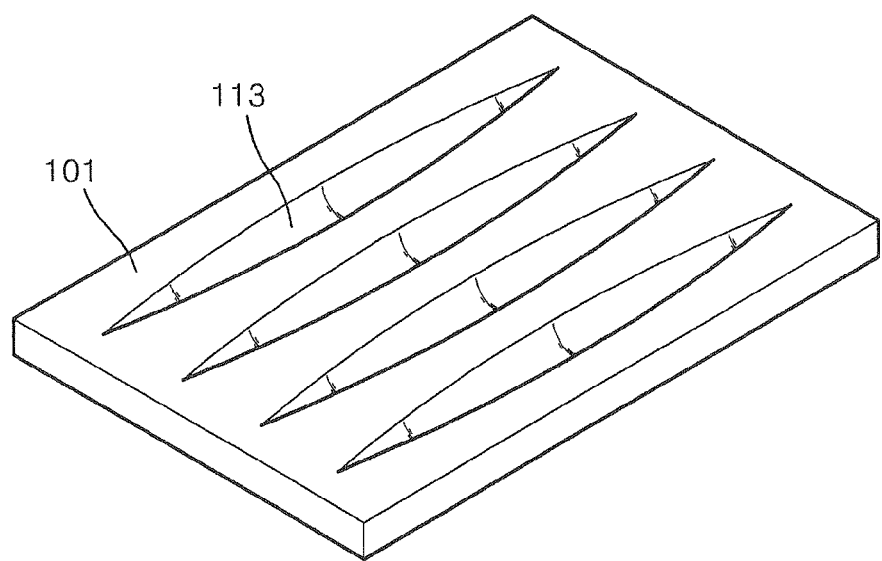

The grooves 110 may be formed to be concave with respect to the light extracting surface A. In other words, the grooves 110 may be recessed inwardly from a surface of the sealing substrate 101. FIGS. 2 through 4 illustrate grooves 111, 112, and 113 formed in various shapes. Referring to FIG. 2, the grooves 111 may be formed concavely with respect to the surface of the sealing substrate 101. The grooves 111 may have the form of concave lenses. In particular, the grooves 111 may have the form of spherical concave lenses or oval concave lenses. The grooves 111 may be separated from one another, and formed at regular or irregular distances from each other.

When the grooves 111 are formed at regular distances, the grooves 111 may be formed in a manner that one groove is spatially aligned with one of the organic light emitting devices included in the organic light emitting unit 103. Thus, in this case, one groove corresponds only to one light emitting device, and a line connecting the center of the groove to the center of the light emitting device is perpendicular to the surface of the organic light emitting device. As described above, the organic light emitting device is formed of a first electrode layer, a light emitting layer, and a second electrode layer. When external light passes through the sealing substrate 101 and is incident on the organic light emitting devices, the light is reflected on the first electrode layer and is transmitted to the outside again. Accordingly, the visibility of the organic light emitting display may decrease. However, according to the present invention, the grooves are formed to respectively correspond to the organic light emitting devices, and thus external light that is incident on the organic light emitting devices is refracted in the grooves, and the amount of light that is incident on the first electrode layer of the organic light emitting device is reduced. Accordingly, according to the current embodiment of the present invention, the reflectivity of external light is reduced.

When the grooves 111 are formed to respectively correspond to the organic light emitting devices, the size of the grooves 111, that is, the diameter thereof, may be smaller than the size of the organic light emitting devices. When the organic light emitting devices are rectangular, the size of the grooves 111 may be smaller than the width of the rectangular organic light emitting devices. For example, when the width of the organic light emitting devices is 60 µm, the size of the groove 111 may be smaller than 60 µm.

Also, the distances between the grooves 111 may be greater than the distances between the organic light emitting devices. For example, when the distance between the organic light emitting devices is 15 µm, the grooves 111 may be separated from one another at distances of 15 µm or greater. When the grooves 111 are formed to respectively correspond to the organic light emitting devices and to have a size greater than the distances between the organic light emitting devices, the size of the grooves 111 can be adjusted according to the distances therebetween.

As shown in FIG. 3, the grooves 112 may be formed to partly overlap one another. Also, as shown in FIG. 4, the grooves 113 may be formed to have a concave shape extending in one direction. In detail, the grooves 113 may be formed concavely in the form of slits. However, the shape of the grooves is not limited to the above examples, and the grooves may also be formed irregularly.

The grooves 110, 111, 112, and 113 may be formed by scratching a surface of the sealing substrate 101 and spraying an etchant thereon. When the etchant is sprayed onto the surface of the sealing substrate 101 in which scratches are formed, the etchant soaks into the scratches, and thus portions of the sealing substrate 101, in which the scratches are formed, are etched more deeply than portions, in which no scratch is formed, thereby obtaining concave patterns. A method of manufacturing these concave patterns will be described hereinafter.

As light generated in the organic light emitting unit 103 is transmitted through the light extracting surface A as described above, the user can watch images through the light extracting surface A. Also, as the light extracting surface A is directed to the outside, light is incident from the outside. Light incident from the outside is reflected on the light extracting surface A and may reduce the visibility of the organic light emitting display device 100.

To prevent reflection of the external light incident on a light extracting surface, a polarization film has been used in the conventional art. However, a polarization film has low light transmittance and thus decreases the brightness of the organic light emitting device. In addition, the price of the polarization film is high, thus increasing the manufacturing cost.

According to the current embodiment of the present invention, a plurality of the grooves 110 are formed in the surface A of the sealing substrate 101 to reduce reflectivity of external light incident on the light extracting surface, thereby increasing the visibility of the organic light emitting display device. In detail, when light from the outside is incident on the light extracting surface A in which the concave grooves 110, 111, 112, or 113 are formed, the external light is refracted internally inside the sealing substrate 101 due to the concave grooves 110, 111, 112, or 113, and can be diffused via total internal reflection inside the sealing substrate 101. Accordingly, the reflectivity of the external light incident on the light extracting surface is reduced, and thus the visibility of the organic light emitting display device increases. Also, since the reflectivity of external light can be reduced, the sealing substrate having the grooves, instead of a polarization film, can be used to prevent the reflection. Thus, the manufacturing cost can be reduced. Also, since a plurality of grooves are formed in the sealing substrate 101, when attaching other films onto the sealing substrate 101, the surface area of the sealing substrate 101 is increased due to the grooves, and thus the adhesion of the sealing substrate 101 and other films can be improved.

Figure 5:
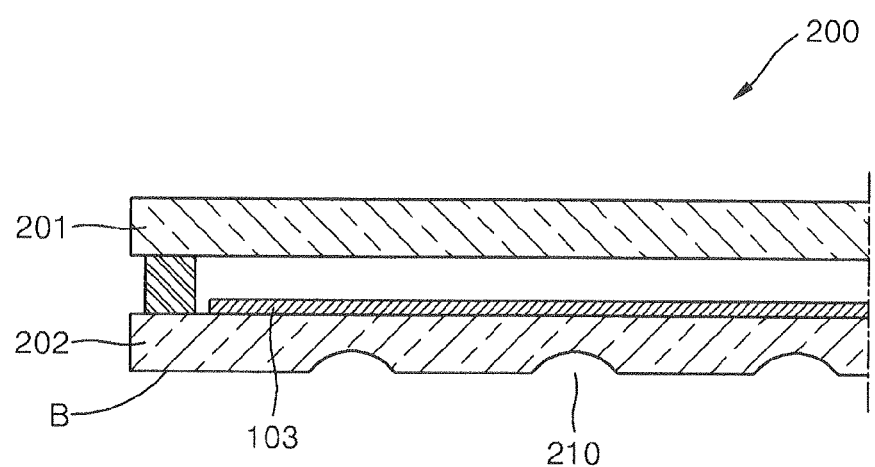
FIG. 5 is a cross-sectional view of an organic light emitting display device according to another embodiment of the present invention.

FIG. 5 is a cross-sectional view of an organic light emitting display device 200 according to another embodiment of the present invention. The organic light emitting display device of FIG. 5 is a bottom emission type organic light emitting display device. That is, light generated in the organic light emitting unit 103 may be emitted to the outside through a substrate 202 instead of a sealing substrate 201. Accordingly, a light extracting surface B of the organic light emitting display device 200 is a surface of the substrate 202 directed to the outside. A plurality of grooves 210 may be formed in a surface B of the substrate 202 directed to the outside. As described above, the grooves 210 may be concave with respect to the light extracting surface B, and may be arranged as illustrated in FIGS. 2 through 4. Also, although not shown in the drawing, the grooves 210 may be formed irregularly.

Hereinafter, a method of manufacturing a substrate according to an embodiment of the present invention will be described, and processes thereof are illustrated in FIGS. 6 through 9.

Figure 6:
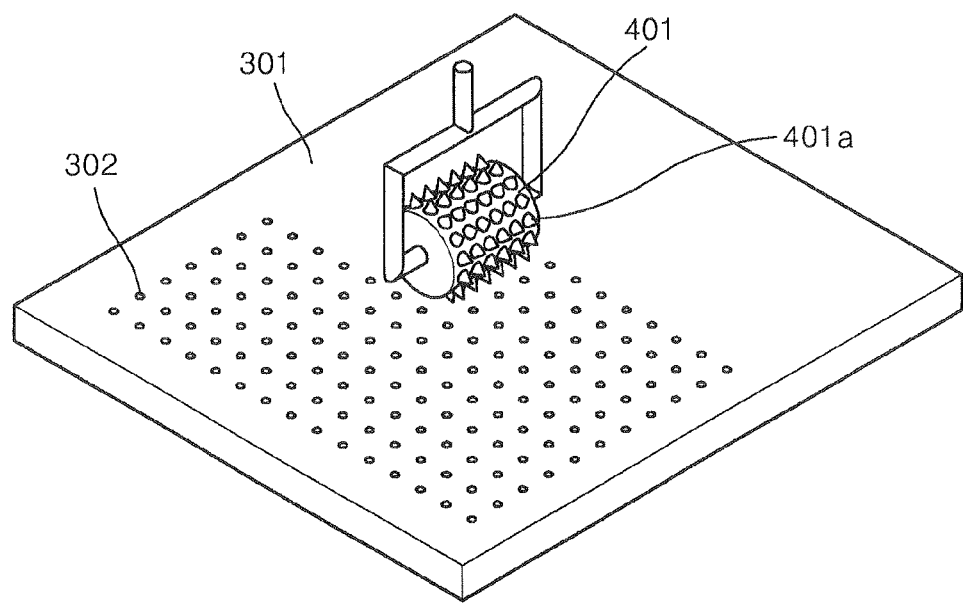
FIGS. 6 through 9 illustrate a process of manufacturing a substrate according to an embodiment of the present invention.
Figure 7:
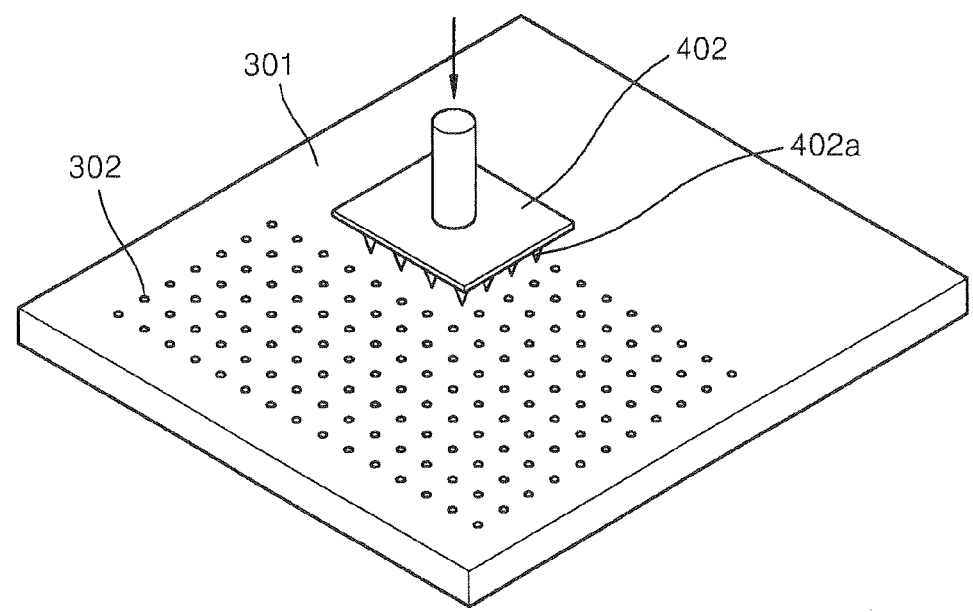

First, as illustrated in FIGS. 6 and 7, a substrate 301 is provided, and then fine scratches 302 are formed in a surface of the substrate 301. In order to form the scratches 302 in the surface of the substrate 301, a cylindrical roller 401 including sharp protrusions 401a on its outer circumference may be rolled along the surface of the substrate 301 as illustrated in FIG. 6. As the cylindrical roller 401 is rolled while applying a predetermined force toward the surface of the substrate 301, scratches 302 may be formed in the surface of the substrate 301. The arrangement of the scratches 302 formed on the surface of the substrate 301 may differ according to the arrangement of the protrusions 401a formed on the outer circumference of the roller 401. Since the protrusions 401a of the roller 401 should be able to form scratches in the substrate 301, the hardness of the protrusions 401a of the roller 401 may preferably be greater than the hardness of the substrate 301. For example, when the substrate 301 is formed of glass, the protrusions 401a of the roller 401 have greater hardness than the glass.

The present invention is not limited to the use of the cylindrical roller 401, and other means capable of forming scratches 302 in the surface of the substrate 301 may also be used. As illustrated in FIG. 7, by pressing a stamp 402 having protrusions 402 on a surface of the stamp 301, scratches 302 may be formed on the surface of the substrate 301.

Figure 8:
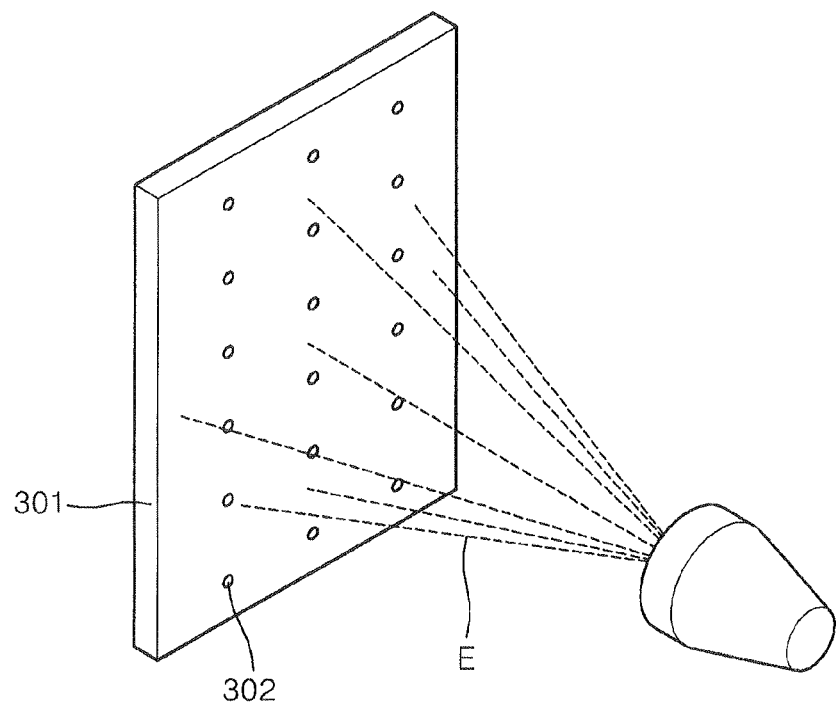

Next, referring to FIG. 8, an etchant E is sprayed onto the surface of the substrate 301 to form a plurality of grooves 310. In detail, an etchant E is sprayed onto a surface of the substrate 301 in which the scratches 302 are formed. The etchant E sprayed onto the surface of the substrate 301 etches the surface of the substrate 301. When the surface of the substrate 301 is etched, the etching speed is uniform, and thus the concave grooves 310 may be formed in portions of the substrate 301 where the scratches 302 are formed with respect to portions where the scratches 302 are not formed. The size or depth of the grooves 310 can be adjusted by controlling the composition or density of the etchant E, the etching temperature, the spray speed, the etching time, etc.

Figure 9:
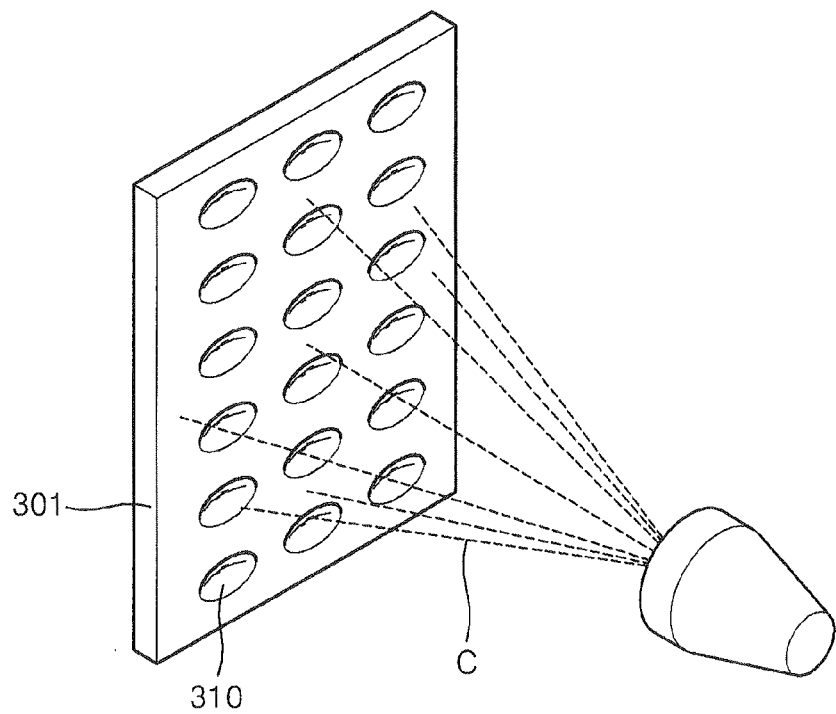

Then, as illustrated in FIG. 9, after spraying the etchant E onto the substrate of the substrate 301, the surface is cleansed using a cleansing solution C. That is, the cleansing solution C can remove the etchant E sprayed on the surface of the substrate 301.

Figure 10:
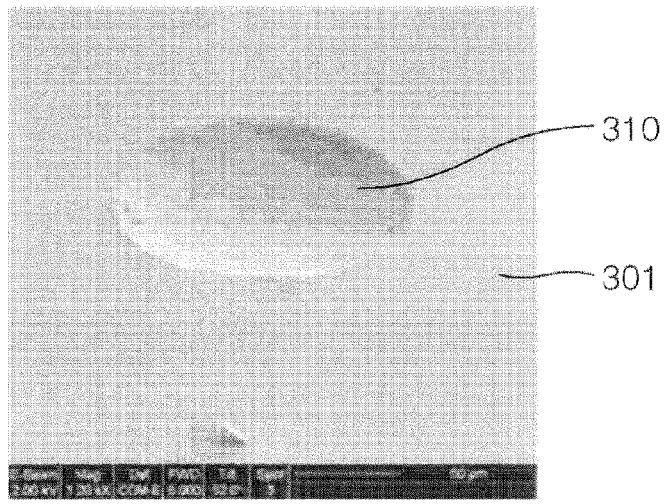
FIG. 10 is a photographic image showing a groove formed by etching.

FIG. 10 is a photographic image showing the groove 310 formed by etching. The groove 310 has a form of a concave lens.

Figure 11:
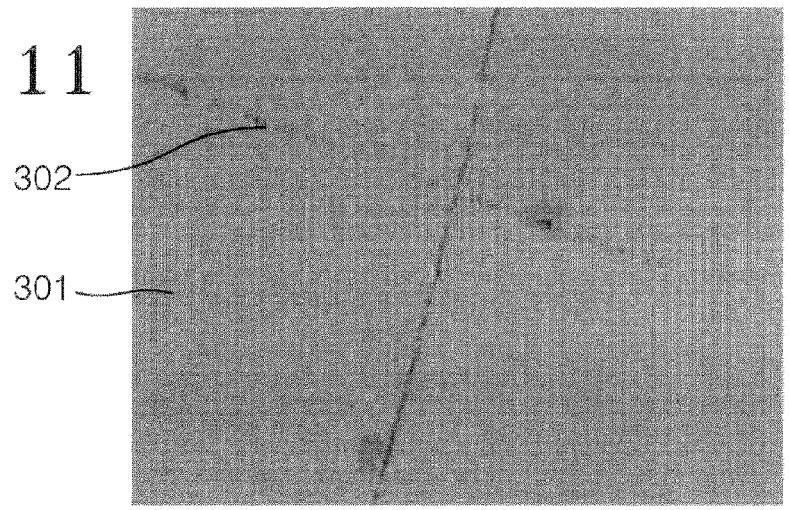
FIG. 11 is a photographic image showing a scratch formed in a substrate.
Figure 12:
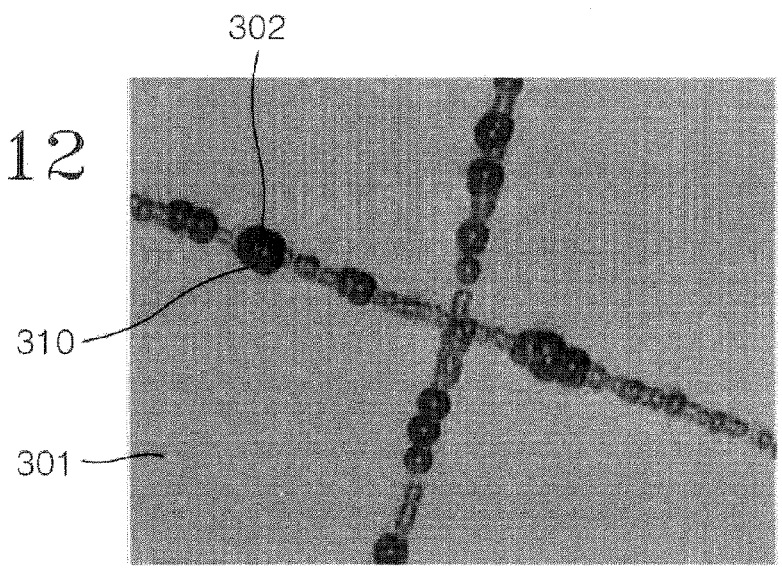
FIG. 12 is a photographic image showing grooves formed after etching.

FIG. 11 illustrate a scratch 302 formed in the substrate 301, and FIG. 12 illustrates the grooves 310 formed after etching. The concave grooves 310 are formed around the scratches 302 after etching.

Hereinafter, a method of manufacturing an organic light emitting display device according to an embodiment of the present invention will be described. FIGS. 13 through 17 illustrate processes of the method of manufacturing an organic light emitting display device.

Figure 13:
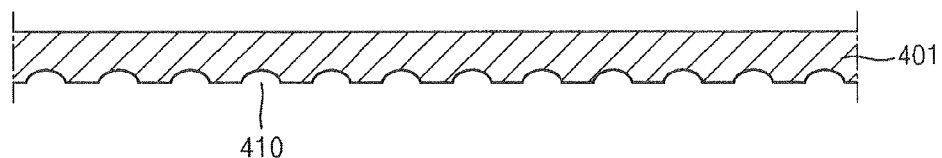
FIGS. 13 through 17 illustrate processes of manufacturing an organic light emitting display device according to an embodiment of the present invention.

Referring to FIG. 13, a sealing substrate 401, in which a plurality of grooves 410 is formed, is provided. The grooves 410 may be formed in the same manner as illustrated in FIGS. 6 through 9.

Figure 14:
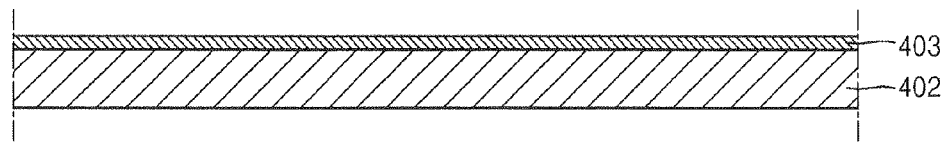
Figure 15:
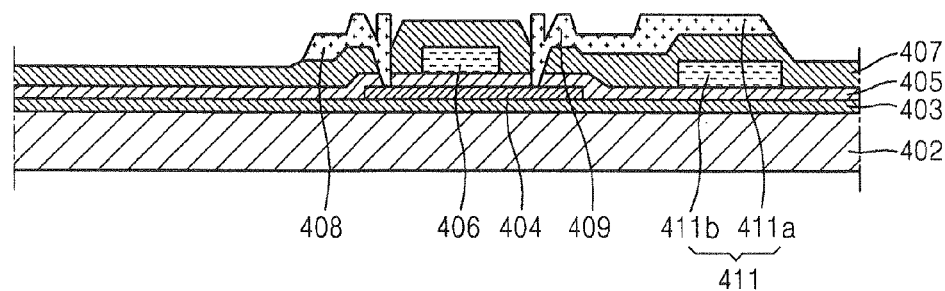
Figure 16:
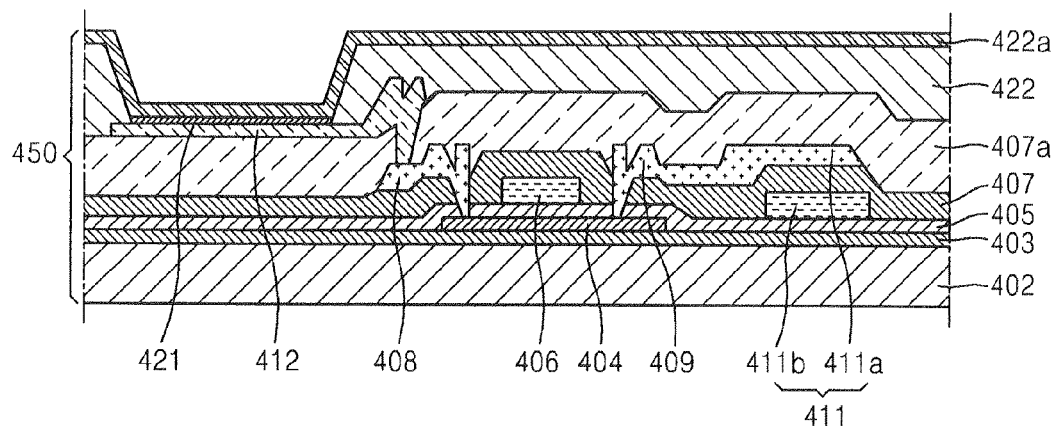

Then, as illustrated in FIGS. 14 through 16, an organic light emitting unit 450 is formed on the substrate 402. The organic light emitting unit 450 may be formed in the following manner.

First, as illustrated in FIG. 14, a buffer layer 403 is formed on a surface of the substrate 402. Then, as illustrated in FIG. 15, a p-type or an n-type semiconductor layer 404 arranged in a predetermined pattern on the buffer layer 403 and a gate insulating layer 405 burying the semiconductor layer 404 are formed, and a gate electrode layer 406 corresponding to the semiconductor layer 404 and a first insulating layer 407 burying the gate electrode layer 406 are formed on the gate insulating layer 405, and a thin film transistor layer formed of a drain electrode 408 and a source electrode 409 electrically connected to both ends of the semiconductor layer 404 via the first insulating layer 407 and the gate insulating layer 405 is formed.

Drain electrode 408 and the source electrode 409 penetrate the first insulation layer 407 and the gate insulation layer 405 and are electrically connected to opposite sides, respectively, of the semiconductor layer 404. Meanwhile, a first auxiliary electrode 411*b* is formed on a bottom surface of the first insulation layer 407 to face a second auxiliary electrode 411*a*, which is formed on a top surface of the gate insulation layer 405 during the formation of the gate electrode 406, thereby forming a capacitor 411. The second auxiliary electrode 411*a* is connected to the source electrode 409. Meanwhile, as illustrated in FIG. 16, a second insulating layer 407*a* is formed on the top surface of the first insulating layer 407, and a first electrode layer 412 that is electrically connected to the drain electrode 408 is formed on the second insulating layer 407*a*, and a third insulating layer 422 is formed on the second insulating layer 407*a* so as to expose the first electrode layer 412. An organic layer 421 is formed on the first electrode layer 412 by deposition or printing, and a second electrode layer 422*a*, which is a cathode, is formed on the 421 and the third insulating layer 422.

The method of forming the above-described organic light emitting unit 450 is not limited to the current embodiment and may be modified in various manners. That is, the method of forming the organic light emitting unit 450 may vary according to the structure of the organic light emitting unit 450.

Figure 17:
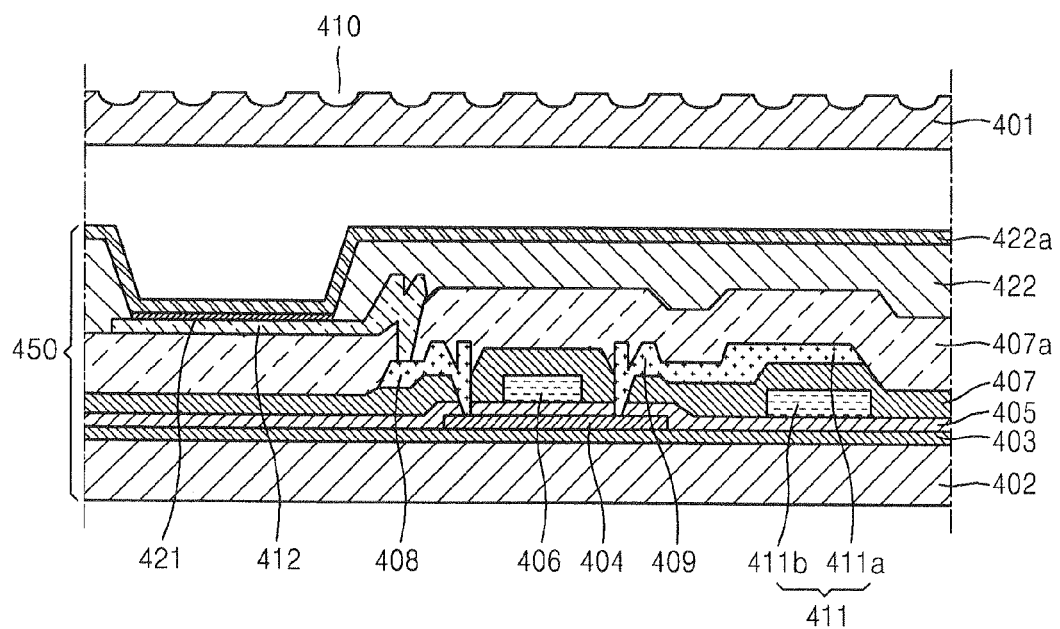

When the formation of the organic light emitting unit 450 on the substrate 402 is completed as described above, the sealing substrate 401 is disposed above the organic light emitting unit 450 as illustrated in FIG. 17. The surface of the sealing substrate 401 in which the grooves 410 are formed is directed to the outside, and the sealing substrate 401 and the substrate 402 are bonded so that the organic light emitting unit 450 is disposed between the sealing substrate 401 and the substrate 402. The sealing substrate 401 and the substrate 402 may be bonded using a bonding member (not shown) disposed on the boundaries of the sealing substrate 401 and the substrate 402.

Figure 18:
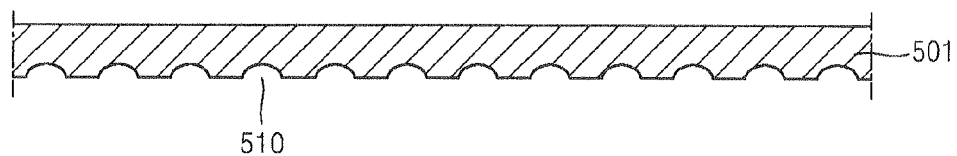
FIGS. 18 through 20 illustrate processes of manufacturing an organic light emitting display device according to another embodiment of the present invention.
Figure 19:
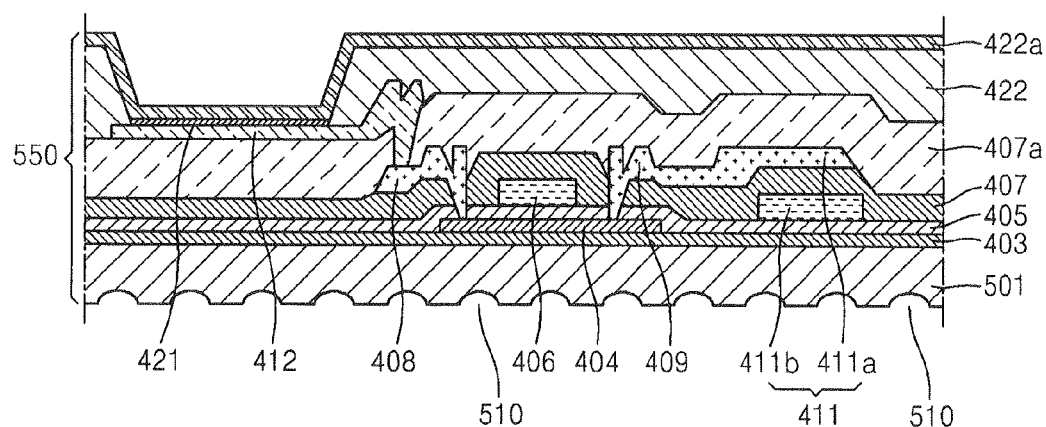
Figure 20:
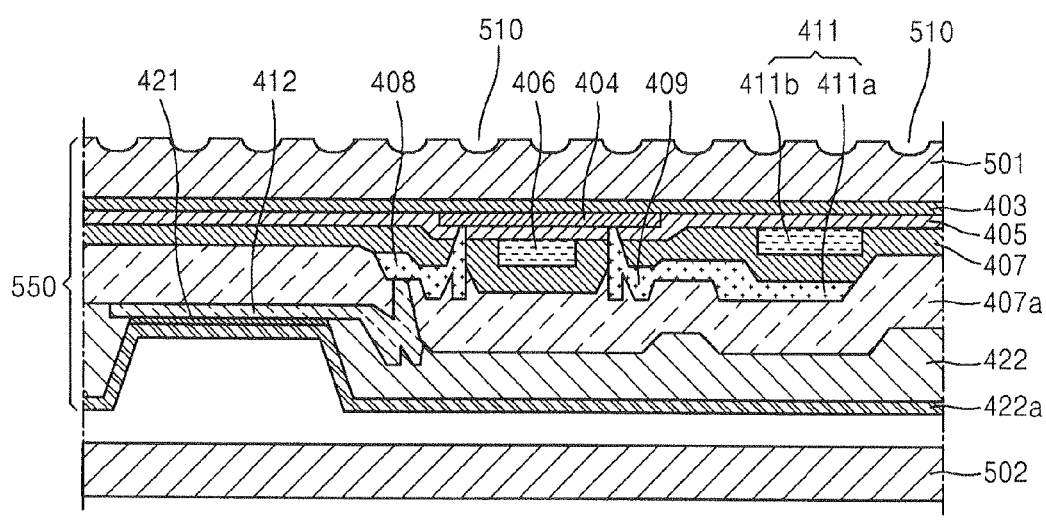

FIGS. 18 through 20 illustrate processes of a method of manufacturing an organic light emitting display device according to another embodiment of the present invention. Referring to FIG. 18, a substrate 501, which has a plurality of grooves 510 on its surface, is provided. The method of forming grooves 510 is as described above.

Then, an organic light emitting unit 550 is formed on the other surface of the substrate 501. That is, a plurality of grooves 510 are formed in one surface of the substrate 501, and the organic light emitting unit 550 is formed on the other surface of the substrate 501. This is a difference from the method of manufacturing the organic light emitting display device illustrated in FIGS. 13 through 17.

The organic light emitting unit 550 is manufactured in the same manner as the organic light emitting unit 450 illustrated in FIGS. 14 through 16, and thus description thereof will be omitted.

Next, a sealing substrate 502 having at least one even surface is provided.

Next, the substrate 501 and the sealing substrate 502 are bonded such that the organic light emitting unit 550 is disposed between the substrate 501 and the sealing substrate 502. The substrate 501 and the sealing substrate 502 can be bonded using a bonding member (not shown) disposed on the boundaries of the substrate 501 and the sealing substrate 502.

The organic light emitting display device manufactured according to the method illustrated in FIGS. 13 through 17 is a top emission type organic light emitting display device, and the organic light emitting display device manufactured according to the method illustrated in FIGS. 18 through 20 is a bottom emission type organic light emitting display device.

While the present invention has been particularly shown and described with reference to exemplary embodiments thereof, it will be understood by those of ordinary skill in the art that various substitutions, changes, or modifications in form and details may be made therein without departing from the spirit and scope of the present invention as defined by the following claims.

What is claimed is:

1. A method of manufacturing a substrate, the method comprising:
   providing a substrate;
   forming a plurality of scratches in a surface of the substrate, the scratches being separated from each other; and
   spraying an etchant onto the surface of the substrate to form a plurality of grooves from the scratches.

2. The method of claim 1, wherein the scratches are formed at regular distances from each other.

3. The method of claim 1, wherein the scratches are formed at irregular distances from each other.

4. The method of claim 1, wherein the grooves are concavely formed with respect to the surface of the substrate.

5. The method of claim 1, wherein the step of forming the plurality of grooves comprises:
   etching the surface of the substrate by the etchant; and
   cleansing the surface of the substrate.

* * * * *